(12) United States Patent
Koda et al.

(10) Patent No.: US 7,601,987 B2
(45) Date of Patent: Oct. 13, 2009

(54) SEMICONDUCTOR LIGHT EMITTING DEVICE

(75) Inventors: Rintaro Koda, Tokyo (JP); Takahiro Arakida, Kanagawa (JP); Yuji Masui, Kanagawa (JP); Tomoyuki Oki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/078,382

(22) Filed: Mar. 31, 2008

(65) Prior Publication Data

US 2008/0251794 A1 Oct. 16, 2008

(30) Foreign Application Priority Data

Apr. 2, 2007 (JP) ............... 2007-096653

(51) Int. Cl.
*H01L 27/15* (2006.01)
*H01L 29/26* (2006.01)
*H01L 31/12* (2006.01)
*H01L 33/00* (2006.01)

(52) U.S. Cl. ............... 257/79; 257/80; 257/84; 257/88; 257/98; 257/E33.001

(58) Field of Classification Search .......... 257/79, 257/80, 84, 88, 98, E33.001
See application file for complete search history.

(56) References Cited

U.S. PATENT DOCUMENTS 4,509,854 A * 4/1985 Pearson ............... 355/38
4,668,078 A * 5/1987 Pearson ............... 355/32
4,803,523 A * 2/1989 Pearson ............... 355/32
4,845,529 A * 7/1989 Pearson et al. ........ 355/32
5,239,338 A * 8/1993 Pearson et al. ........ 355/32
2008/0117947 A1 * 5/2008 Masui et al. ......... 372/50.21

FOREIGN PATENT DOCUMENTS

JP 2877785 1/1999

* cited by examiner

*Primary Examiner*—Thao X Le
*Assistant Examiner*—Thanh Y Tran
(74) *Attorney, Agent, or Firm*—Rader, Fishman & Grauer PLLC; Christopher M. Tobin

(57) ABSTRACT

The present invention provides a semiconductor light emitting device realizing a lower detection level of spontaneous emission light by a semiconductor photodetector and an improvement in light detection precision by selectively reflecting spontaneous emission light. The semiconductor light emitting device includes a semiconductor light emitting element for generating light including stimulated emission light having a wavelength $\lambda o$ and spontaneous emission light having a wavelength band including the wavelength $\lambda o$, a multilayer filter having a stack structure in which a low-refractive-index layer having a thickness of $\lambda_1/(4 \times n_a)$ ($\lambda_1 < \lambda o$ and $n_a$ denote refractive index) and a high-refractive-index layer having a thickness of $\lambda_1/(4 \times n_b)$ ($n_b > n_a$ and $n_b$ denote refractive index) are alternately stacked, and a semiconductor photodetector having a light absorption layer that absorbs part of the light passed through the multilayer filter.

10 Claims, 11 Drawing Sheets

SEMICONDUCTOR LIGHT EMITTING DEVICE

CROSS REFERENCE TO RELATED APPLICATIONS

The present invention contains subject matter related to Japanese Patent Application JP 2007-096653 filed in the Japanese Patent Office on Apr. 2, 2007, the entire contents of which are incorporated herein by reference.

BACKGROUND OF THE INVENTION

1. Field of the Invention

The present invention relates to a semiconductor light emitting device having a photodetector for detecting emitted light and, more particularly, to a semiconductor light emitting device which can be suitably applied to uses requesting a high-degree light detection precision.

2. Description of the Related Art

Up to this time, in a semiconductor light emitting device for the use of an optical fiber, an optical disk, and the like, as part of the object of making the light output level of a semiconductor light emitting element assembled in the device constant, emission light of the semiconductor light emitting element was detected by a light detecting mechanism. The light detecting mechanism may have been constructed by, for example, a reflector that branches part of the emission light and a semiconductor photodetector that detects the branched emission light. In the configuration, however, the number of parts increased and, moreover, a disadvantage occurred such that the reflector and the semiconductor photodetector had to be disposed with a high precision with respect to the semiconductor light emitting element. As one of the measures for solving such a disadvantage, the semiconductor light emitting element and the semiconductor photodetector were formed integrally.

However, when the semiconductor light emitting element and the semiconductor photodetector are formed integrally, there is the possibility that the semiconductor photodetector detects not only stimulated emission light to be inherently detected but also spontaneous emission light. In such a case, the light output level of the semiconductor light emitting element measured on the basis of light detected by the semiconductor photodetector includes an error only by the amount of spontaneous emission light. Therefore, the method is also unsuitable for uses in which high-precision control on the light output level is requested.

Japanese Patent No. 2,877,785 discloses a technique of providing a control layer in a semiconductor photodetector and interrupting part of the spontaneous emission light input from a semiconductor light emitting element before the semiconductor photodetector detects it.

SUMMARY OF THE INVENTION

The control layer is formed by oxidizing part of the semiconductor material of the semiconductor photodetector. The oxidized semiconductor material may not selectively reflect spontaneous emission light and transmits some spontaneous emission light. A part which is not oxidized in the control layer hardly attenuates but transmits the spontaneous emission light. Therefore, the technique of Japanese Patent No. 2,877,785 does not sufficiently lower the spontaneous emission light detection level of the semiconductor photodetector and has a disadvantage such that the light detection precision may not be sufficiently improved.

It is therefore desirable to provide a semiconductor light emitting device with a lowered spontaneous emission light detection level of a semiconductor photodetector and realizing an improved light detection precision by selectively reflecting the spontaneous emission light.

According to an embodiment of the present invention, there is provided a first semiconductor light emitting device including a semiconductor light emitting element, a multilayer filter, and a semiconductor photodetector. The semiconductor light emitting element generates light that includes stimulated emission light having a wavelength $\lambda o$ and spontaneous emission light having a wavelength band including the wavelength $\lambda o$. The multilayer filter has a stack structure in which a low-refractive-index layer having a thickness of $\lambda_1/(4 \times n_a)$ ($\lambda_1 < \lambda o$ and $n_a$ denote the refractive index) and a high-refractive-index layer having a thickness of $\lambda_1/(4 \times n_b)$ ($n_b > n_a$ and $n_b$ denote the refractive index) are alternately stacked. The semiconductor photodetector has a light absorption layer that absorbs part of the light passed through the multilayer filter.

In the first semiconductor light emitting device of the embodiment of the present invention, a stimulated emission is repeated in the semiconductor light emitting element. As a result, light including the predetermined wavelength $\lambda o$ is output from the semiconductor light emitting element. The light output from the semiconductor light emitting element includes not only the stimulated emission light but also spontaneous emission light. The stimulated emission light is light having the wavelength $\lambda o$, and the bandwidth of the light is extremely narrow. On the other hand, the spontaneous emission light is light including the wavelength $\lambda o$, and the bandwidth of the light is much wider than that of the stimulated emission light. Since the multilayer filter has a stack structure in which a low-refractive-index layer having a thickness of $\lambda_1/(4 \times n_a)$ and a high-refractive-index layer having a thickness of $\lambda_1/(4 \times n_b)$ are stacked alternately, the stimulated emission light in the light output from the semiconductor light emitting element passes through the multilayer filter and enters the light absorption layer in the semiconductor photodetector. On the other hand, light having a wavelength band shorter than the wavelength $\lambda o$ in the spontaneous emission light is reflected by the multilayer filter and returns to the semiconductor light emitting element. As a result, the amount of the spontaneous emission light passing through the multilayer filter becomes much smaller than that of the stimulated emission light passing through the multilayer filter.

In the case where the multilayer filter has a stack structure in which a low-refractive-index layer having a thickness of $\lambda_2/(4 \times n_c)$ and a high-refractive-index layer having a thickness of $\lambda_2/(4 \times n_d)$ are alternately stacked, light having a wavelength band shorter than the wavelength $\lambda o$ in the spontaneous emission light and a wavelength band longer than the wavelength $\lambda o$ in the spontaneous emission light is reflected by the multilayer filter and returns to the semiconductor light emitting element. As a result, the amount of the spontaneous emission light passing through the multilayer filter becomes much smaller than that of the stimulated emission light passing through the multilayer filter.

According to an embodiment of the present invention, there is provided a second semiconductor light emitting device including a semiconductor light emitting element, a multilayer filter, and a semiconductor photodetector. The semiconductor light emitting element generates light including stimulated emission light having a wavelength $\lambda o$ and spontaneous emission light having a wavelength band including the wavelength $\lambda o$. The multilayer filter has a stack structure in which a low-refractive-index layer having a thickness of $\lambda_2/(4\times n_c)$ ($\lambda_2<\lambda o$ and $n_c$ denote the refractive index) and a high-refractive-index layer having a thickness of $\lambda_2/(4\times n_d)$ ($n_d>n_c$ and $n_d$ denote the refractive index) are alternately stacked. The semiconductor photodetector has a light absorption layer that absorbs part of the light passed through the multilayer filter.

In the second semiconductor light emitting device of the embodiment of the present invention, a stimulated emission is repeated in the semiconductor light emitting element. As a result, light including the predetermined wavelength $\lambda o$ is output from the semiconductor light emitting element. The light output from the semiconductor light emitting element includes not only the stimulated emission light but also spontaneous emission light. The stimulated emission light is light having the wavelength $\lambda o$, and the bandwidth of the light is extremely narrow. On the other hand, the spontaneous emission light is light including the wavelength $\lambda o$, and the bandwidth of the light is much wider than that of the stimulated emission light. Since the multilayer filter has a stack structure in which a low-refractive-index layer having a thickness of $\lambda_2/(4\times n_c)$ and a high-refractive-index layer having a thickness of $\lambda_2/(4\times n_d)$ are stacked alternately, the stimulated emission light in the light output from the semiconductor light emitting element passes through the multilayer filter and enters the light absorption layer in the semiconductor photodetector. On the other hand, light having a wavelength band longer than the wavelength $\lambda o$ in the spontaneous emission light is reflected by the multilayer filter and returns to the semiconductor light emitting element. As a result, the amount of the spontaneous emission light passing through the multilayer filter becomes much smaller than that of the stimulated emission light passing through the multilayer filter.

In the first semiconductor light emitting device of the embodiment of the present invention, the multilayer filter has the stack structure in which the low-refractive-index layer having a thickness of $\lambda_1/(4\times n_a)$ and the high-refractive-index layer having a thickness of $\lambda_1/(4\times n_b)$ are stacked alternately. The multilayer filter is provided between the semiconductor light emitting element and the semiconductor photodetector. Consequently, the spontaneous emission light is reflected selectively by the multilayer filter, and the incidence of spontaneous emission light to the semiconductor photodetector is effectively suppressed. As a result, the spontaneous emission light detection level of the semiconductor photodetector may be lowered, so that the light detection precision may be improved further.

In the case where the multilayer filter has a stack structure in which a low-refractive-index layer having a thickness of $\lambda_2/(4\times n_c)$ and a high-refractive-index layer having a thickness of $\lambda_2/(4\times n_d)$ are stacked alternately, the spontaneous emission light is selectively reflected by the multilayer filter, and the incidence to the semiconductor photodetector of the spontaneous emission light is effectively interrupted. As a result, the spontaneous emission light detection level of the semiconductor photodetector may be lowered further. Thus, the light detection precision may be markedly improved.

In the second semiconductor light emitting device of the embodiment of the present invention, the multilayer filter has the stack structure in which the low-refractive-index layer having a thickness of $\lambda_2/(4\times n_c)$ and the high-refractive-index layer having a thickness of $\lambda_2/(4\times n_d)$ are stacked alternately. The multilayer filter is provided between the semiconductor light emitting element and the semiconductor photodetector. Consequently, the spontaneous emission light is selectively reflected by the multilayer filter, and the incidence of spontaneous emission light to the semiconductor photodetector is suppressed effectively. As a result, the spontaneous emission light detection level of the semiconductor photodetector may be lowered, so that the light detection precision may be improved further.

Other and further objects, features and advantages of the invention will appear more fully from the following description.

DETAILED DESCRIPTION OF THE PREFERRED EMBODIMENTS

Embodiments of the present invention will be described in detail herein below with reference to the drawings.

First Embodiment

Figure 1:
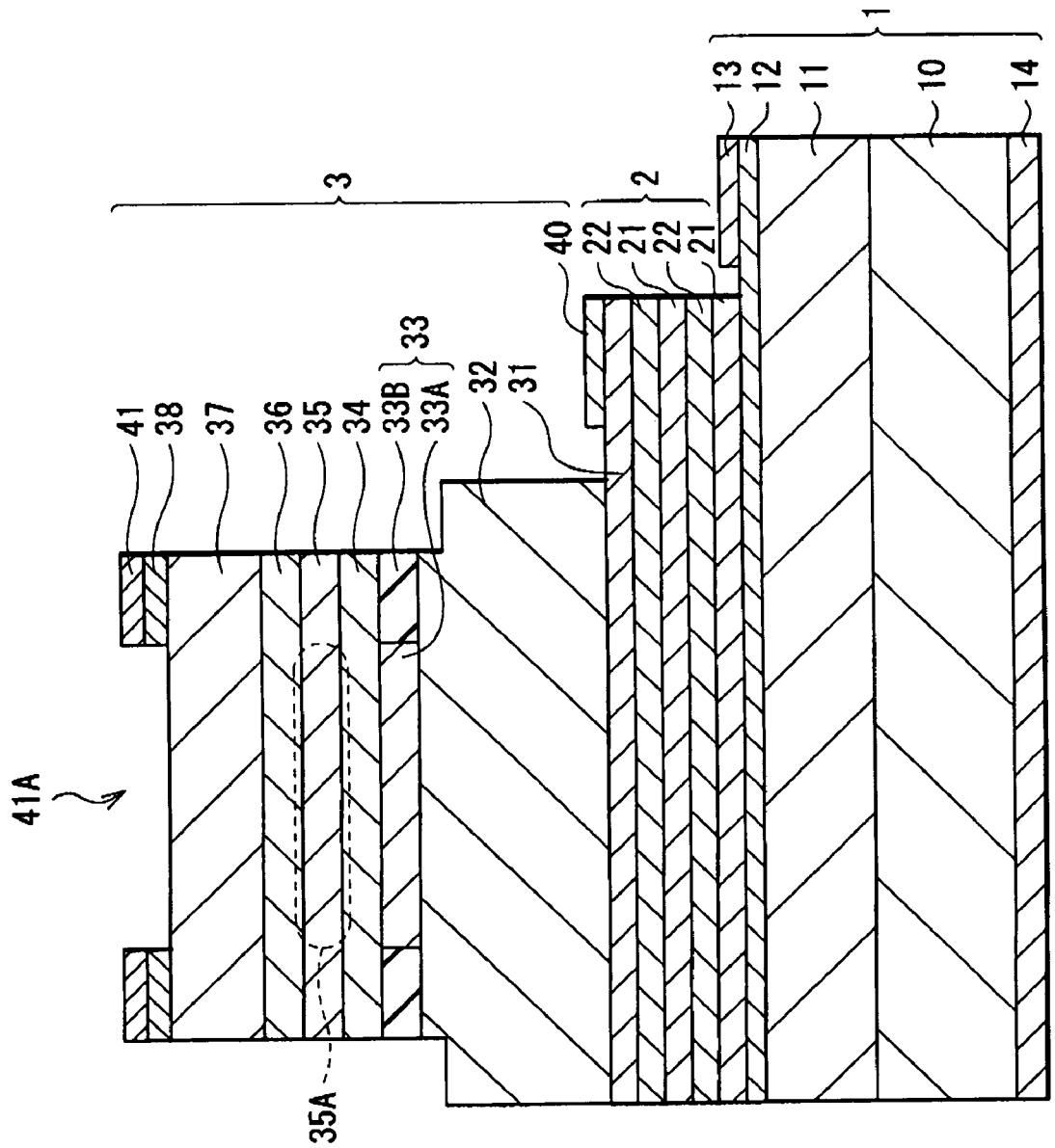
FIG. 1 is a sectional configuration diagram of a semiconductor light emitting device as a first embodiment of the invention.

FIG. 1 shows a sectional configuration of a semiconductor light emitting device as a first embodiment of the present invention. FIG. 1 is a schematic diagram, and the dimensions and shapes are different from the actual ones. The semiconductor light emitting device is constructed by disposing a multilayer filter 2 (first multilayer filter) and a vertical cavity surface emitting laser (VCSEL) 3 in order on a semiconductor photodetector 1. The semiconductor photodetector 1, the multilayer filter 2, and the VCSEL 3 are formed integrally.

In the semiconductor light emitting device, light of the VCSEL 3 is emitted from an aperture 41A (which will be described later) to the outside and is slightly output to the semiconductor photodetector 1 via the multilayer filter 2. Specifically, in the semiconductor light emitting device, the multilayer filter 2 and the semiconductor photodetector 1 are stacked in this order from the VCSEL 3 side on the side opposite to the side where the light of the VCSEL 3 is emitted mainly to the outside. An electric signal (photocurrent)

according to the output level of light leaked to the semiconductor photodetector 1 side is output from the semiconductor photodetector 1.

VCSEL 3

The VCSEL 3 has a stack structure in which, for example, a p-type contact layer 31, a p-type DBR layer 32, a current confinement layer 33, a p-type cladding layer 34, an active layer 35, a n-type cladding layer 36, a n-type DBR layer 37, and a n-type contact layer 38 are stacked in order on the multilayer filter 2. The stack structure has, for example, a mesa shape including steps in a side face of the p-type DBR layer 32 and a step in a side face around the border between the p-type DBR layer 32 and the p-type contact layer 31.

The p-type contact layer 31 is made of, for example, a p-type $Al_{x1}Ga_{1-x1}As$ ($0 \leq x1 \leq 1$). Examples of a p-type impurity are zinc (Zn), magnesium (Mg), and beryllium (Be).

The p-type DBR layer 32 is constructed by alternately stacking a low-refractive-index layer (not shown) and a high-refractive-index layer (not shown). The low-refractive-index layer is made of, for example, p-type $Al_{x2}Ga_{1-x2}As$ ($0<x2 \leq 1$) having a thickness of $\lambda o/4n_1$ ($\lambda o$ denotes the oscillation wavelength and $n_1$ denotes the refractive index), and the high-refractive-index layer is made of, for example, p-type $Al_{x3}Ga_{1-x3}As$ ($0 \leq x3 < x2$) having a thickness of $\lambda o/4n_2$ ($n_2$ denotes the refractive index).

The current confinement layer 33 has a current confinement area 33B in its outer edge area and a current injection area 33A in its center area. The current injection area 33A is made of, for example, p-type $Al_{x4}Ga_{1-x4}As$ ($0<x4 \leq 1$). The current confinement area 33B is made of, for example, a material containing $Al_2O_3$ (aluminum oxide) and, as will be described later, is obtained by oxidizing Al of high density included in a current confinement layer 33D from the side face. Therefore, the current confinement layer 33 has the function of confining current.

The p-type cladding layer 34 is made of, for example, p-type $Al_{x5}Ga_{1-x5}As$ ($0 \leq x5 \leq 1$). The active layer 35 is made of, for example, undoped $Al_{x6}Ga_{1-x6}As$ ($0 \leq x6 \leq 1$). In the active layer 35, an area facing the current injection area 33A is a light emission area 35A. The n-type cladding layer 36 is made of, for example, n-type $Al_{x7}Ga_{1-x7}As$ ($0 \leq x7 \leq 1$). Examples of the n-type impurity are silicon (Si) and selenium (Se).

The n-type DBR layer 37 is formed by alternately stacking a low-refractive-index layer (not shown) and a high-refractive-index layer (not shown). The low-refractive-index layer is made of, for example, n-type $Al_{x8}Ga_{1-x8}As$ ($0<x8 \leq 1$) having a thickness of $\lambda o/4n_3$ ($n_3$ denotes the refractive index), and the high-refractive-index layer is made of, for example, n-type $Al_{x9}Ga_{1-x9}As$ ($0 \leq x9 < x8$) having a thickness of $\lambda o/4n_4$ ($n_4$ denotes the refractive index).

The n-type contact layer 38 is made of, for example, n-type $Al_{x10}Ga_{1-x10}As$ ($0 \leq x10 \leq 1$). The n-type contact layer 38 has, for example, an aperture corresponding to the light emission area 35A and a donut shape.

The VCSEL 3 also includes a p-side electrode 40 in a part which is not in contact with the p-type DBR layer 32 in the surface of the p-type contact layer 31, and has an n-side electrode 41 on the n-type contact layer 38.

The p-side electrode 40 has a structure obtained by stacking, for example, titanium (Ti), platinum (Pt), and gold (Au) in order from the p-type contact layer 31 side, and is electrically connected to the p-type contact layer 31.

The n-side electrode 41 has a structure obtained by stacking an alloy of gold (Au) and germanium (Ge), nickel (Ni), and gold (Au) in order from the n-type contact layer 38 side, and is electrically connected to the n-type contact layer 38. The n-side electrode 41 has, for example, the aperture 41A in correspondence with the light emission area 35A and a donut shape.

Semiconductor Photodetector 1

The semiconductor photodetector 1 has, on a substrate 10, a light absorption layer 11, a p-type contact layer 12, and a p-side electrode 13 in order from the substrate 10 side and has, on the back side of the substrate 10, a n-side electrode 14.

The substrate 10 is made of, for example, n-type GaAs. The light absorption layer 11 is made of, for example, undoped $Al_{x11}Ga_{1-x11}As$ ($0 \leq x11 \leq 1$). The light absorption layer 11 absorbs part of the light output from the light emission area 35A and converts the absorbed light to an electric signal. The electric signal is input as a light output monitor signal to a light output computing circuit (not shown) connected to the semiconductor photodetector 1, and is used for measuring the output level of light passed through the multilayer filter 2 in the light output computing circuit. The p-type contact layer 12 is made of, for example, p-type $Al_{x12}Ga_{1-x12}As$ ($0 \leq x12 \leq 1$). On the surface of the p-type contact layer 12, the multilayer filter 2 and the p-side electrode 13 are provided.

The p-side electrode 13 has a structure obtained by stacking, for example, Ti, Pt, and Au in order from the p-type contact layer 12 side, and is electrically connected to the p-type contact layer 12. The n-side electrode 14 has a structure in which, for example, an AuGe alloy, Ni, and Au are stacked in order from the substrate 10 side, and is electrically connected to the substrate 10.

Multilayer Filter 2

The multilayer filter 2 transmits stimulated emission light included in the light output from the VCSEL 3 to the semiconductor photodetector 1, and selectively reflects spontaneous emission light included in the light output from the VCSEL 3 to the semiconductor photodetector 1 side to the VCSEL 3. The multilayer filter 2 is provided between the bottom (the p-type contact layer 31) of the VCSEL 3 and the top (the p-type contact layer 12) of the semiconductor photodetector 1, and is formed by alternately stacking a low-refractive-index layer 21 and a high-refractive-index layer 22.

The low-refractive-index layer 21 is made of, for example, p-type $Al_{x13}Ga_{1-x13}As$ ($0<x13 \leq 1$) having a thickness of $\lambda 1/4n_5$ ($\lambda_1$ denotes the center wavelength of the multilayer filter 2 and $n_5$ denotes the refractive index), and the high-refractive-index layer 22 is made of, for example, p-type $Al_{x14}Ga_{1-x14}As$ ($0 \leq x14 < x13$) having a thickness of $\lambda_1/4n_6$ ($n_6$ denotes the refractive index). Although FIG. 1 shows the case where two low-refractive-index layers 21 and two high-refractive-index layers 22 are stacked on the semiconductor photodetector 1, the number of the low-refractive-index layers 21 and the high-refractive-index layers 22 may be three or more.

The semiconductor light emitting device having such a configuration may be manufactured as follows.

FIGS. 2A and 2B to FIGS. 4A and 4B show the manufacturing method in the process order. To manufacture the semiconductor light emitting device, a semiconductor layer made of a GaAs compound semiconductor is formed by an epitaxial crystal growth method, such as MOCVD (Metal Organic Chemical Vapor Deposition), on the entire surface of the substrate 10 made of n-type GaAs. As the material of the GaAs compound semiconductor, for example, trimethyl aluminum (TMA), trimethyl gallium (TMG), or arsine ($AsH_3$) is used. As the material of donor impurity, for example, hydrogen selenide ($H_2Se$) is used. As the material of acceptor impurity, for example, dimethyl zinc (DMZn) is used.

Figure 2A:
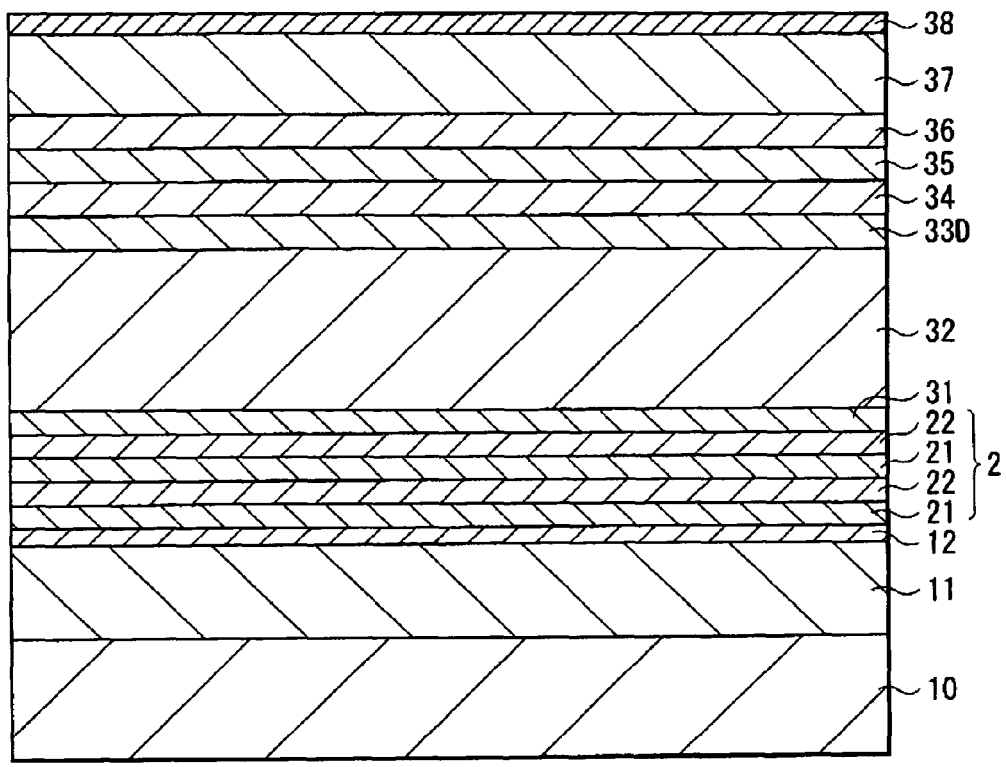
FIGS. 2A and 2B are cross sections illustrating a manufacturing process of the semiconductor light emitting device of FIG. 1.

Concretely, first, the light absorption layer 11, the p-type contact layer 12, the multilayer filter 2, the p-type contact layer 31, the p-type DBR layer 32, the current confinement layer 33D, the p-type cladding layer 34, the active layer 35, the n-type cladding layer 36, the n-type DBR layer 37, and the n-type contact layer 38 are stacked on the substrate 10 in order from the substrate 10 side (FIG. 2A).

Figure 2B:
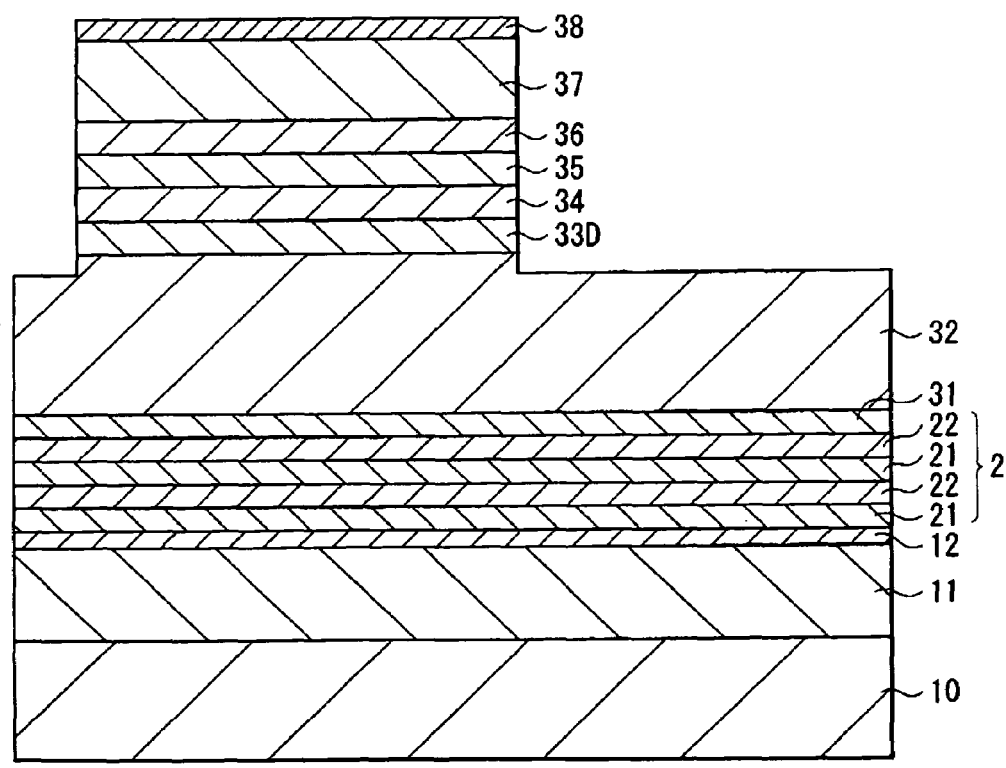

Next, a mask (not shown) is formed in a predetermined area in the surface of the n-type contact layer 38. The n-type contact layer 38, the n-type DBR layer 37, the n-type cladding layer 36, the active layer 35, the p-type cladding layer 34, the current confinement layer 33D, and a part of the p-type DBR layer 32 are selectively etched by, for example, dry etching, thereby forming a mesa shape. After that, the mask is removed (FIG. 2B). At this time, a part of the p-type DBR layer 32 is exposed.

Figure 3A:
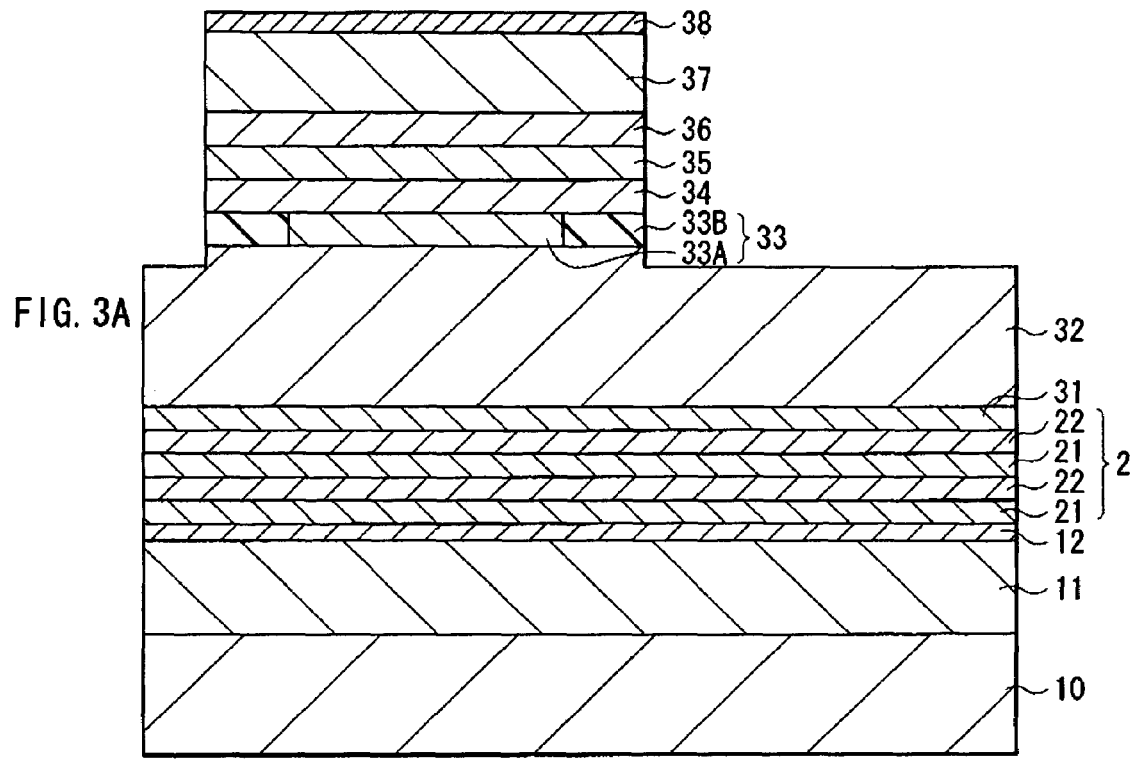
FIGS. 3A and 3B are cross sections illustrating a process subsequent to FIGS. 2A and 2B.
Figure 3B:
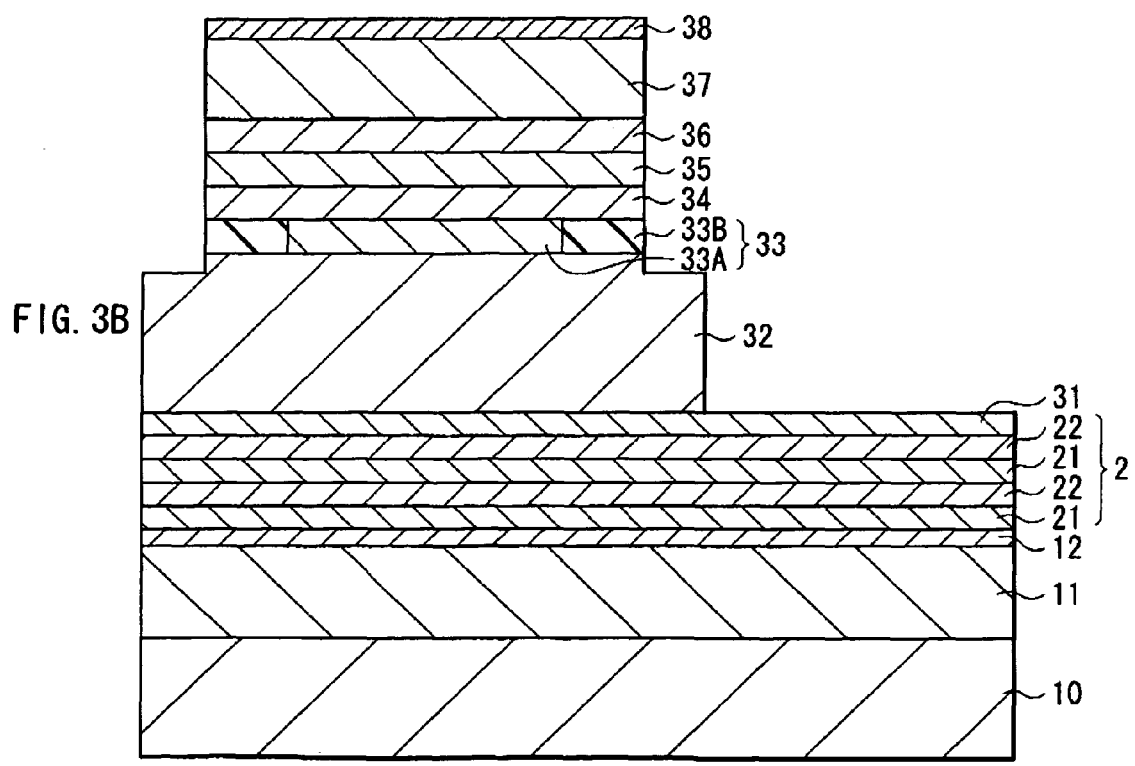

An oxidizing process is performed at high temperature in the vapor atmosphere to selectively oxidize the current confinement layer 33D from the side face of mesa. By this operation, the outer peripheral area of the current confinement layer 33D becomes an insulating layer (aluminum oxide). As a result, the current confinement area 33B is formed in the outer peripheral area, and the center area becomes the current injection area 33A. In such a manner, the current confinement layer 33 is formed (FIG. 3A).

Figure 4A:
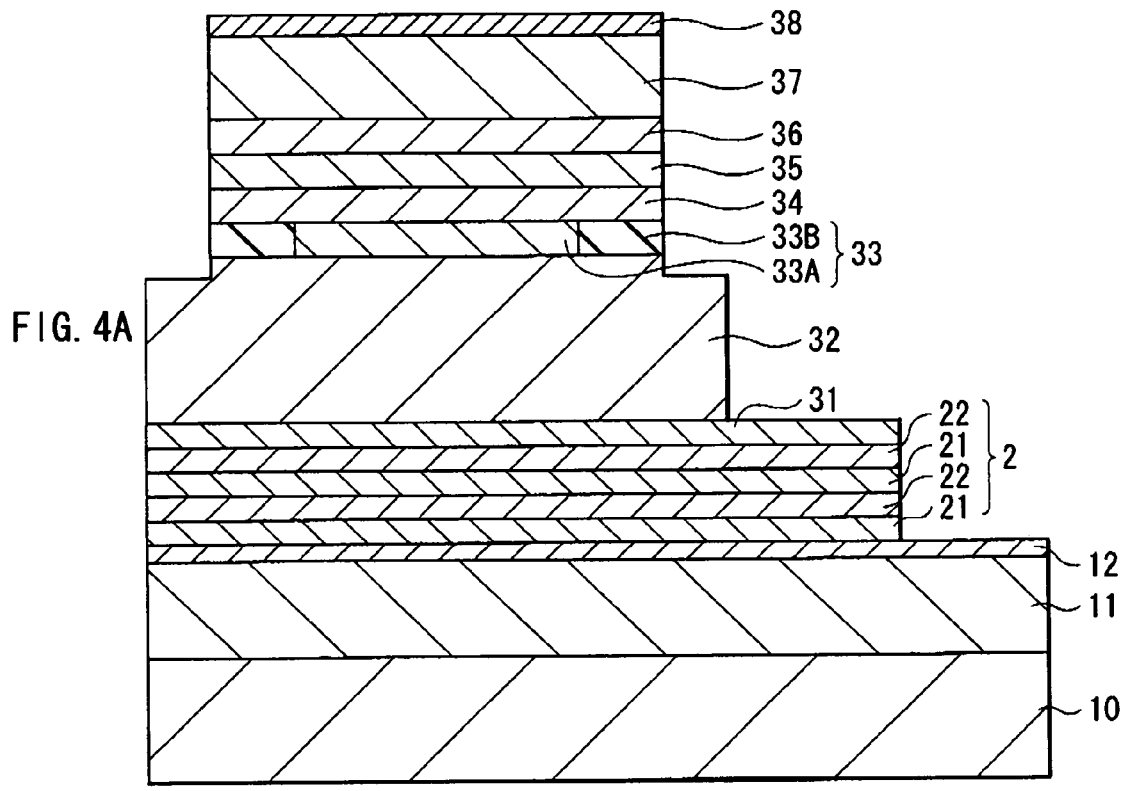
FIGS. 4A and 4B are cross sections illustrating a process subsequent to FIGS. 3A and 3B.
Figure 4B:
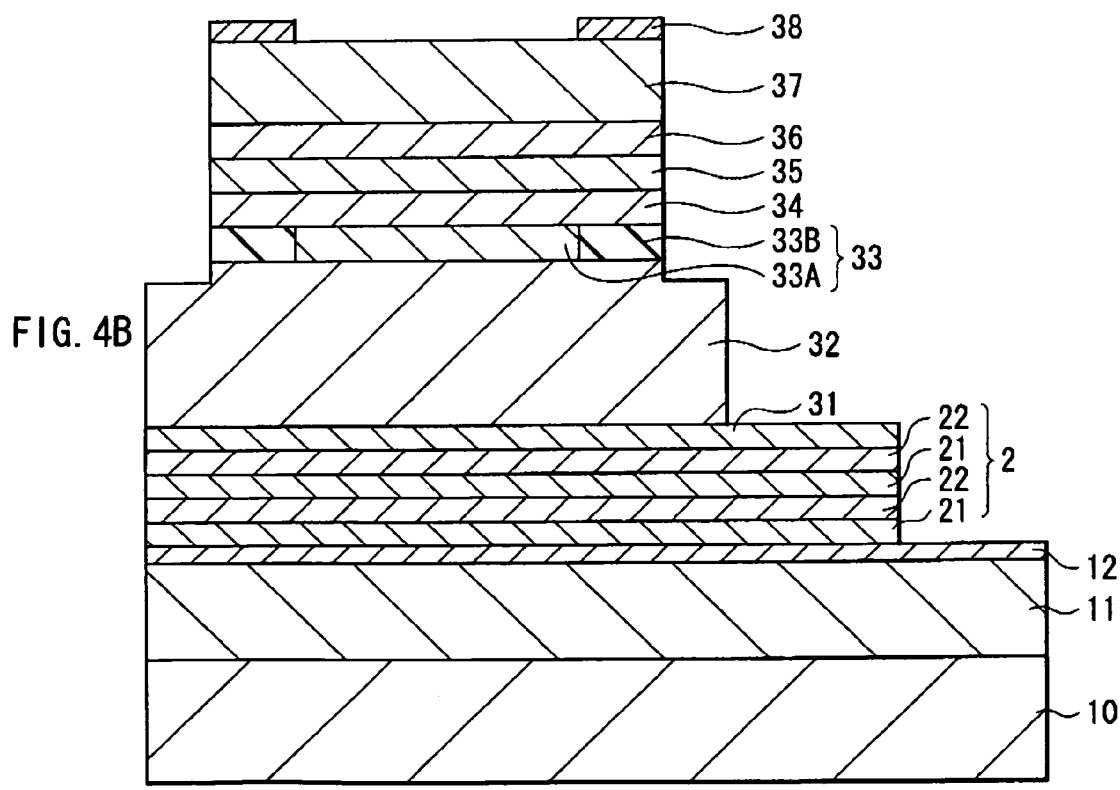

In a manner similar to the above, a part of the exposed portion in the p-type DBR layer 16 is selectively removed (FIG. 3B), thereby forming a mesa shape having a step in the p-type DBR layer 16 and exposing a part of the p-type contact layer 31. Further, in a manner similar to the above, a part of the exposed portion in the p-type contact layer 31 and the multilayer film 2 are selectively removed, thereby forming a mesa shape. After that, the mask is removed (FIG. 4A). Subsequently, a mask (not shown) having an aperture in a center portion of the top face of the mesa is formed. For example, by wet etching, an aperture is formed in the n-type contact layer 38. After that, the mask is removed (FIG. 4B).

Next, for example, by evaporation, the p-side electrode 40 is formed in the exposed part of the p-type contact layer 31, and the p-side electrode 13 is formed in the exposed part of the p-type contact layer 12 (FIG. 1). Further, the n-side electrode 41 having the aperture 41A is formed on the surface of the n-type contact layer 38, and a n-side electrode 42 is formed on the back side of the substrate 10 (FIG. 1). In such a manner, the semiconductor light emitting device of the embodiment is manufactured.

Figure 5:
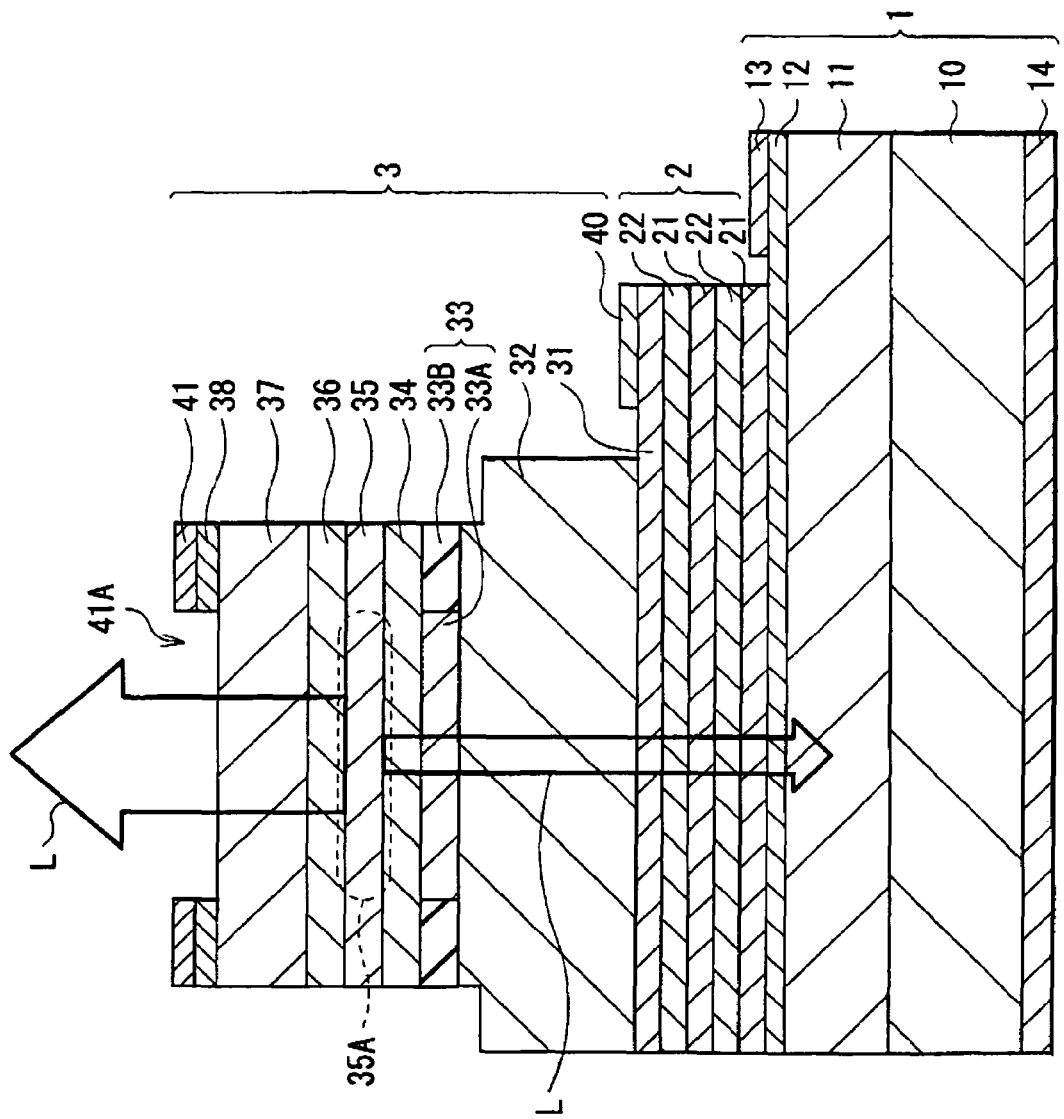
FIG. 5 is a cross section illustrating an operation of the semiconductor light emitting device of FIG. 1.

In the semiconductor light emitting device of the embodiment, when a predetermined voltage is applied across the p-side electrode 40 and the n-side electrode 41, the current confined by the current confinement layer 33 is injected to the light emission area 35A as a gain area of the active layer 35. As a result, light is generated by the recombination of electrons and holes. The light includes not only light generated by stimulated emission but also light generated by spontaneous emission. As a result of the repetition of stimulated emission in the device, a laser oscillation occurs at a predetermined wavelength λo, and the light L including the wavelength λo is output to the outside and the semiconductor photodetector 1 side (FIG. 5).

Since the light absorption layer 11 in the semiconductor photodetector 1 is disposed in correspondence with the light emission area 35A, light output from the VCSEL 3 passes through the multilayer filter 2 and enters the light absorption layer 11. A part of the light entering the light absorption layer 11 is absorbed by the light absorption layer 11 and converted to an electric signal (photocurrent) according to the output level of the absorbed light. The electric signal has an intensity according to the output level of light passed through the multilayer filter 2. The electric signal is output to a light output computing circuit (not shown) via a wire (not shown) electrically connected to the p-side electrode 13 and the n-side electrode 42 and then received as a light output monitor signal in the light output computing circuit. In such a manner, the output level of the light passed through the multilayer filter 2 is measured.

Subsequently, the multilayer filter 2 as one of the features of the embodiment will be described mainly.

Figure 6A:
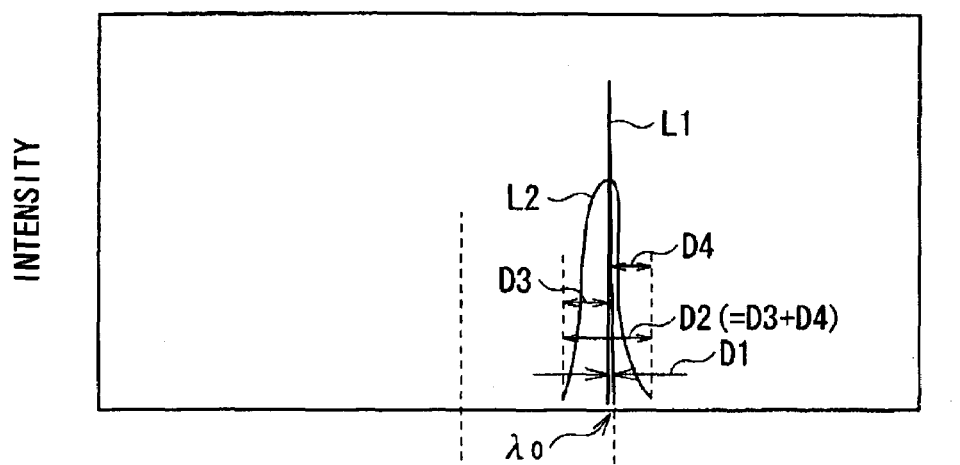
FIG. 6A is a relationship diagram showing an intensity spectrum with respect to wavelength of light emitted from a surface-emitting semiconductor laser of FIG. 1.
Figure 6B:
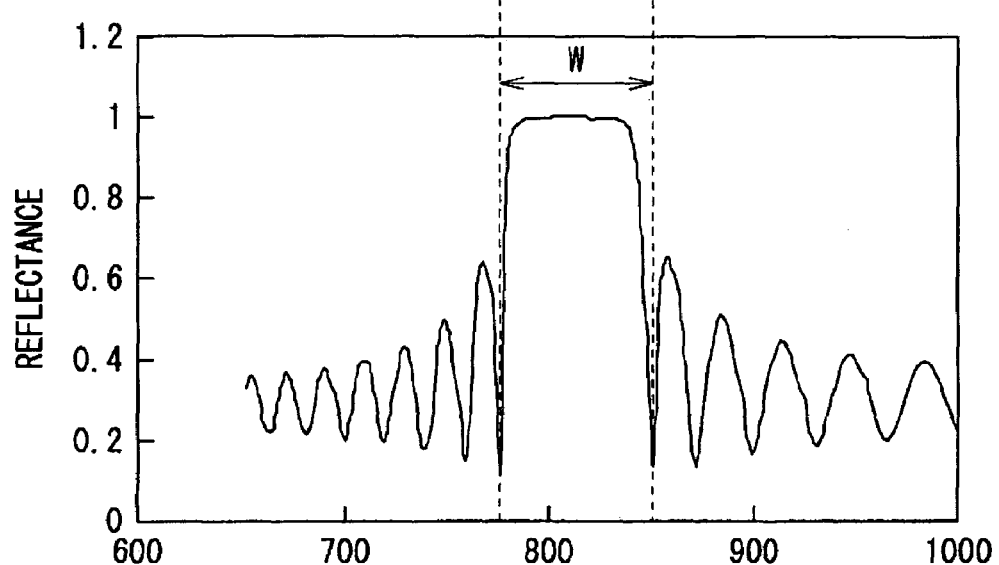
FIG. 6B is a relationship diagram showing a reflectance spectrum with respect to wavelengths of a multilayer filter of FIG. 1.
Figure 7:
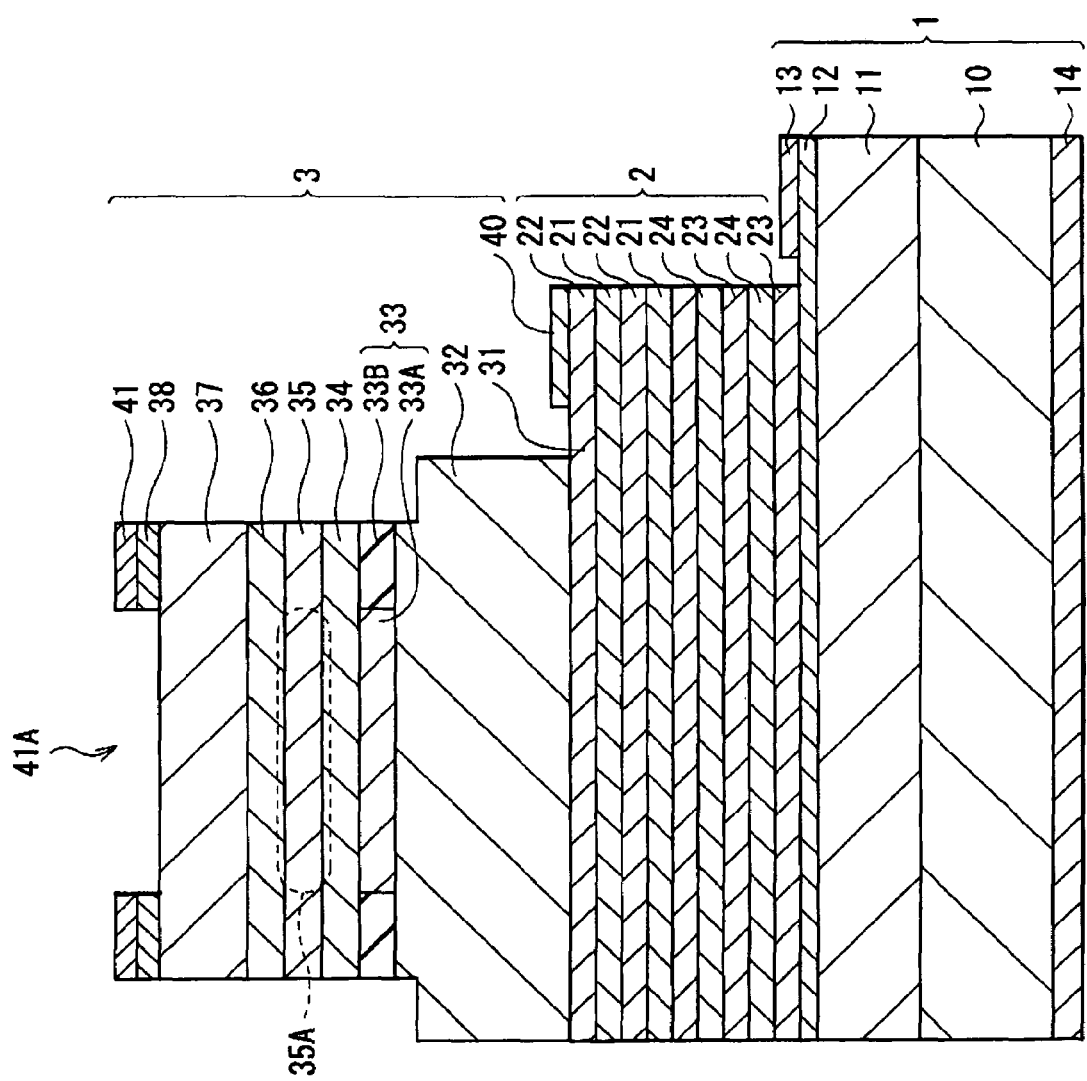
FIG. 7 is a sectional configuration diagram of a semiconductor light emitting device as a modification.

FIG. 6A shows an example of the intensity distribution of light output from the VCSEL 3. FIG. 6B shows an example of a reflectance spectrum of the multilayer filter 2. FIG. 6B shows the reflectance spectrum of the multilayer filter 2 in which 30 low-refractive-index layers 21 made of p-type $Al_{0.9}Ga_{0.1}As$ and each having a thickness of $\lambda_1/4n_5$ and 30 high-refractive-index layers 22 made of p-type $Al_{0.3}Ga_{0.7}As$ and each having a thickness of $\lambda_1/4n_6$ are stacked.

It is understood from FIG. 6A that the light L output from the VCSEL 3 includes not only the stimulated emission light L1 but also the spontaneous emission light L2. The stimulated emission light L1 is light having the wavelength λo, and a width D1 of the wavelength band of the light is extremely narrow. On the other hand, the spontaneous emission light L2 includes light including the wavelength λo, and a width D2 of the wavelength band of the light is much wider than that of the stimulated emission light L1. The intensity distribution of the spontaneous emission light L2 is deviated to the short wavelength side more than that of the wavelength λo. Further, when the width of the wavelength band on the short wavelength side of the spontaneous emission light L2 is D3 and that of the wavelength band on the long wavelength side of the spontaneous emission light L2 is D4, D3 is larger than D4.

It also is understood from FIGS. 6A and 6B that the band W in which the reflectance is the highest in the multilayer filter 2 is equal to or includes the wavelength band on the short wavelength side of the spontaneous emission light L2. The band W does not include the wavelength λo.

When relative wavelength "g" is o/λ, for example, the width Δg of the wavelength band is obtained as follows: width Δg of the wavelength band=$(4/\pi) \times \sin^{-1}((n_H-n_L)/(n_H+n_L))$. "$n_H$" in the following equation denotes the refractive index of the high-refractive-index layer, and "$n_L$" denotes the refractive index of the low-refractive-index layer.

As described above, the band W of the multilayer filter 2 is equal to the wavelength band on the short wavelength side of the spontaneous emission light L2 or includes the wavelength band and does not include the wavelength λo. Consequently, the stimulated emission light L1 included in the light output from the VCSEL 3 to the semiconductor photodetector 1 side passes through the multilayer filter 2 and enters the light absorption layer 11 in the semiconductor photodetector 1. On the other hand, light on the short wavelength side of the wavelength λo in the spontaneous emission light L2 included in the light output from the VCSEL 3 to the semiconductor photodetector 1 side is reflected by the multilayer filter 2 and returns to the VCSEL 3 side. That is, the multilayer filer 2 has the function of selectively reflecting the spontaneous emission light, so that the amount of the spontaneous emission light passing through the multilayer filter 2 may be made much smaller than that of the stimulated emission light passing through the multilayer filter 2. Since the entry to the semiconductor photodetector 1 of the spontaneous emission light may be effectively suppressed, the detection level of the spontaneous emission light of the semiconductor photodetector 1 may be lowered. As a result, the detection precision of the stimulated emission light may be improved further.

In the case of forming the multilayer filter 2 by using a crystal growth method, such as MOCVD, for example, as compared with the case of forming an oxide layer which disturbs the passage of the spontaneous emission light by oxidizing a part of a semiconductor layer by using an oxidizing process which is not easily controlled, as in Japanese Patent No. 2,877,785, the shape, size, and the like may be controlled with a high precision. Therefore, variations in the properties of semiconductor light emitting devices may be reduced extremely.

Since the spontaneous emission light is eliminated, for example, unlike Japanese Patent No. 2,877,785, it is unnecessary to use a process causing volume shrinkage, such as oxidation of the semiconductor layer. Accordingly, there is no possibility that peeling caused by volume shrinkage occurs in the multilayer filter 2. As compared with the case of forming a layer that eliminates the spontaneous emission light by using a process causing volume shrinkage, such as oxidation of the semiconductor layer, the yield and reliability is much higher.

In addition, the layers from the light absorption layer 11 to the n-type contact layer 38 are formed by the epitaxial crystal growth method. Consequently, the manufacturing process may be made simpler than that in the case of forming the multilayer filer 2 by other methods, so that the time necessary for manufacture may be shortened.

In the embodiment, on the side opposite to the side from which most of light of the VCSEL 3 goes to the outside, the multilayer filter 2 and the semiconductor photodetector 1 are disposed in order from the side of the VCSEL 3. Consequently, the space for providing the electrode (the p-side electrode 40) on the semiconductor photodetector 1 side of the VCSEL 3 is not limited by the current confinement diameter of the current confinement layer 33. Therefore, the space for providing the electrode (the p-side electrode 40) on the semiconductor photodetector 1 side of the VCSEL 3 may be made larger than that in the case where the multilayer filter 2 and the semiconductor photodetector 1 are disposed in order from the VCSEL 3 side. Thus, the resistance of the VCSEL 3 may be reduced.

Modification of First Embodiment

In the foregoing embodiment, the case has been described in which the multilayer filter 2 reflects light having a wavelength shorter than the wavelength $\lambda o$ in the spontaneous emission light L2 included in light output from the VCSEL 3 to the semiconductor photodetector 1 side. The multilayer filter 2 may reflect not only light having a wavelength shorter than the wavelength $\lambda o$ in the spontaneous emission light L2 included in light output from the VCSEL 3 to the semiconductor photodetector 1 side but also light having a wavelength longer than the wavelength $\lambda o$.

In this case, it is sufficient to provide the multilayer filter 2 with not only the stack structure obtained by alternately stacking the low-refractive-index layers 21 made of, for example, p-type $Al_{x13}Ga_{1-x13}As$ and each having a thickness of $\lambda_1/4n_5$ and the high-refractive-index layers 22 made of, for example, p-type $Al_{x14}Ga_{1-x14}As$ and each having a thickness of $\lambda_1/4n_6$ but also, on or below the stack structure, a stack structure obtained by alternately stacking low-refractive-index layers 23 made of, for example, p-type $Al_{x15}Ga_{1-x15}As$ ($0<x15\leqq1$) and each having a thickness of $\lambda_2/4n_7$ ($\lambda_2>\lambda o$ and $n_7$ denote the refractive index) and high-refractive-index layers 24 made of, for example, p-type $Al_{x16}Ga_{1-x16}As$ ($0\leqq x16\leqq x15$) and each having a thickness of $\lambda_2/4n_8$ ($n_8>n_7$ and $n_8$ denote the refractive index).

With this structure, the incidence of the spontaneous emission light on the semiconductor photodetector 1 is interrupted. As a result, the detection level of the spontaneous emission light by the semiconductor photodetector 1 is further lowered, so that the detection precision of the stimulated emission light is improved remarkably.

Second Embodiment

Figure 8:
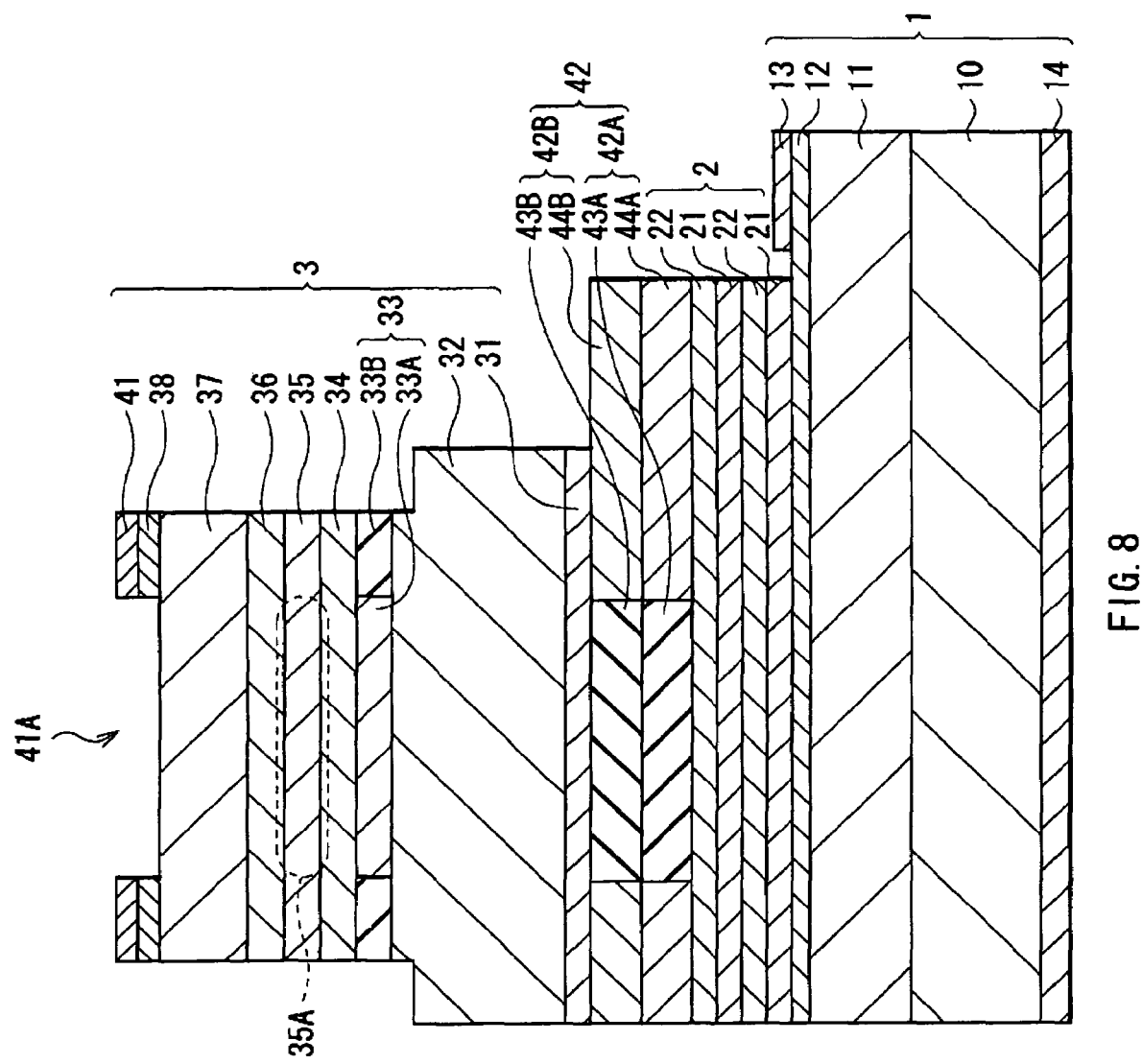
FIG. 8 is a sectional configuration diagram of a semiconductor light emitting device as a second embodiment of the invention.

FIG. 8 shows the structure of a semiconductor light emitting device as a second embodiment of the present invention. FIG. 8 is a schematic diagram, and the dimensions and shapes in FIG. 8 are different from the actual ones. In the following description, when the same reference numeral as that in the foregoing embodiment is used, it means that the component has a configuration and function similar to those of the component having the same reference numeral. The configurations, operations, and effects that are different from those of the foregoing embodiment will be described mainly below. Descriptions of configurations, operations, and effects similar to those of the foregoing embodiment will not be repeated.

The semiconductor light emitting device is formed by bonding the multilayer filter 2 formed on one of the semiconductor photodetector 1 and the VCSEL 3 to the other one on which the multilayer filter 2 is not formed.

The semiconductor light emitting device is obtained by stacking a joining layer 42 and the VCSEL 3 in order on the semiconductor photodetector 1.

The joining layer 42 has a light transmitting part 43 and a metal part 44 in the same plane. The light transmitting part 43 is provided in all or part of an area facing the light emission area 35A in the VCSEL 3. The metal part 44 is provided around the light transmitting part 43.

The light transmitting part 43 is made of a material capable of transmitting light emitted from the light emission area 35A, such as SiN, $SiO_2$ or the like, or an insulating material, such as air. The light transmitting part 43 transmits light emitted to the semiconductor photodetector 1 side in the light emitted from the light emission area 35A. On the other hand, the metal part 44 is made of a metal having high reflectance, for example, gold (Au) or the like, and reflects the light emitted to an area other than the light transmitting part 43 in the light emitted to the semiconductor photodetector 1 side toward the VCSEL 3 side, thereby interrupting entry to the semiconductor photodetector 1. That is, the joining layer 42 not only has the function of joining the semiconductor photodetector 1 and the VCSEL 3 but also the function of regulating the incidence area of light to the semiconductor photodetector 1. The metal part 44 is electrically connected to the p-type contact layer 31 in the VCSEL 3 and also functions as the p-side electrode of the VCSEL 3.

Preferably, the joining layer 42 is formed, for example, according to a manufacturing method which will be described later. At the time of overlapping the multilayer filter 2 with either the semiconductor photodetector 1 or the VCSEL 3, a joining layer 42A having a light transmitting part 43A and a metal part 44A, formed on the surface of the multilayer filter 2, and a joining layer 42B having a light transmitting part 43B and a metal part 44B, formed on the surface of either the semiconductor photodetector 1 or the VCSEL 3, are joined to each other.

In this case, by joining the light transmitting parts 43A and 43B to each other, the light transmitting part 43 is formed. By joining the metal parts 44A and 44B, the metal part 44 is formed. The joining layer 42 may be formed in advance on the surface of either the semiconductor photodetector 1 or the VCSEL 3 or the surface of the multilayer filer 2 at the time of overlapping the multilayer filter 2 with either the semiconductor photodetector 1 or the VCSEL 3.

Figure 9A:
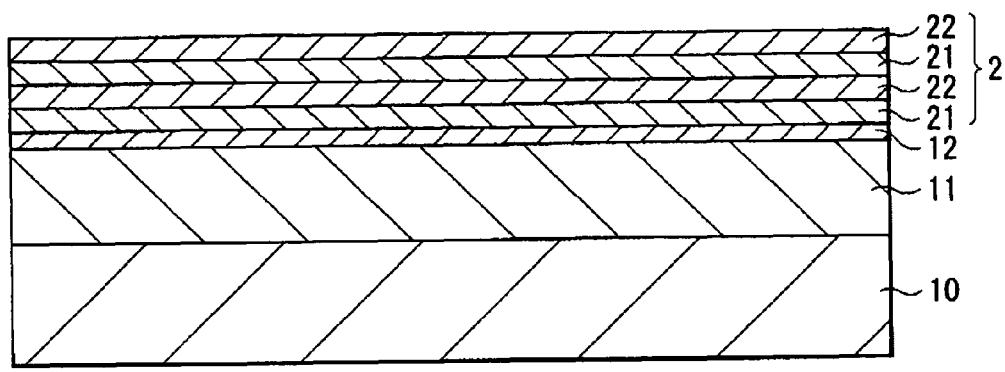
FIGS. 9A and 9B are cross sections illustrating a manufacturing process of the semiconductor light emitting device of FIG. 8.
Figure 9B:
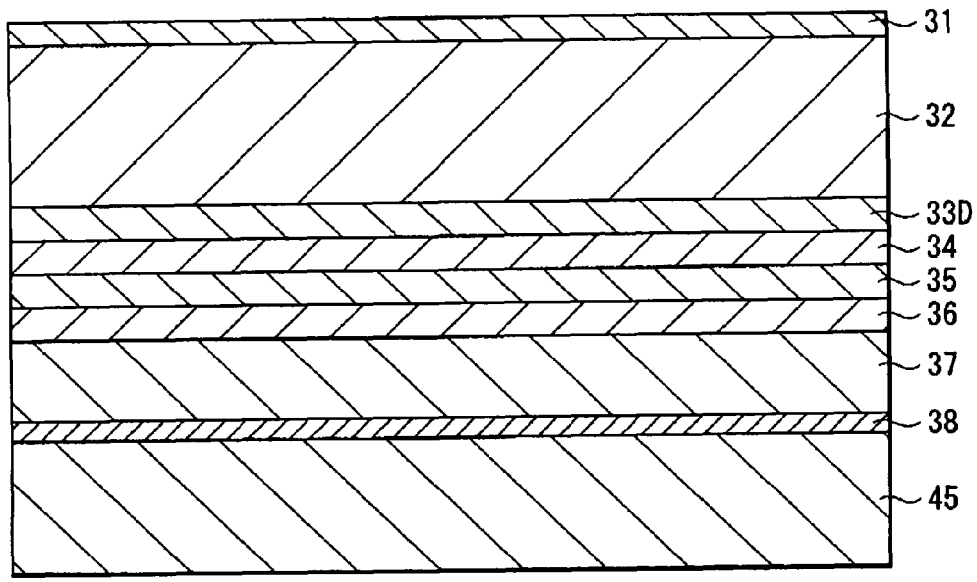

The semiconductor light emitting device having the configuration as described above may be manufactured as follows, as an example. FIGS. 9A and 9B and FIG. 12 show the manufacturing method in process order.

Concretely, first, on the substrate 10, the light absorption layer 11, the p-type contact layer 12, and the multilayer filter 2 are stacked in this order (FIG. 9A). On a substrate 45 made of, for example, n-type GaAs, the n-type contact layer 38, the n-type DBR layer 37, the n-type cladding layer 36, the active layer 35, the p-type cladding layer 34, the current confinement layer 33D, the p-type DBR layer 32, and the p-type contact layer 31 are stacked in order (FIG. 9B).

Figure 10A:
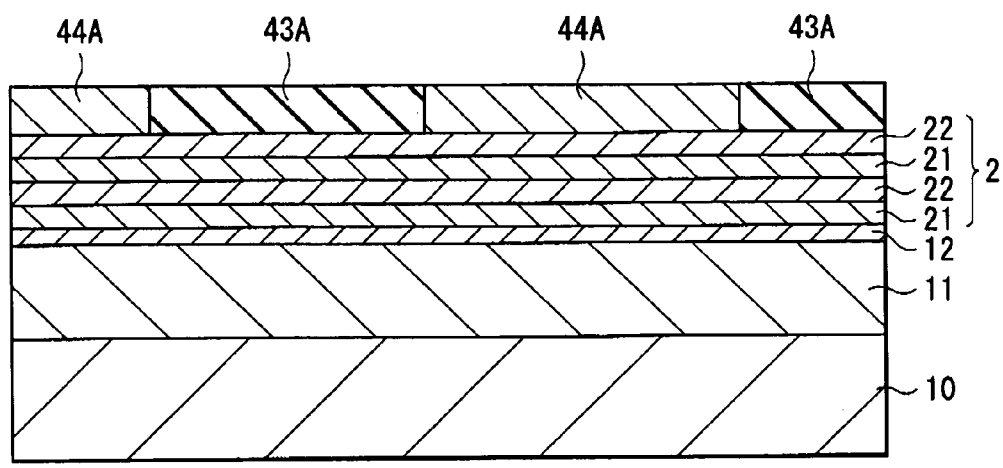
FIGS. 10A and 10B are cross sections illustrating a process subsequent to FIGS. 9A and 9B.
Figure 10B:
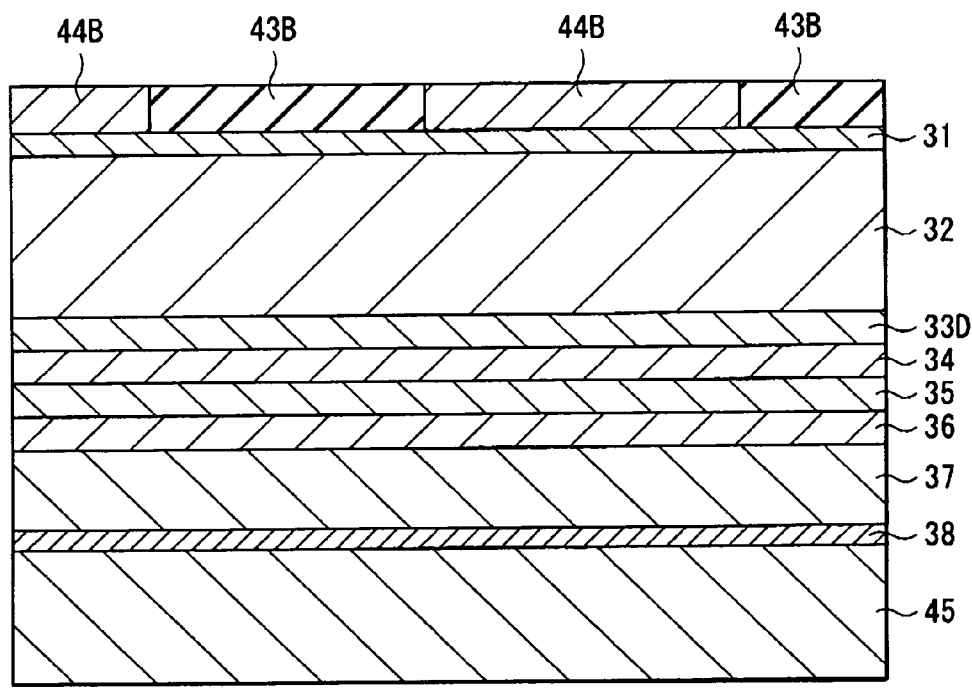

An insulating material, such as $SiO_2$, is deposited on the p-type contact layers 17 and 24. After that, a photoresist (not shown) is formed in an area corresponding to the light emission area 35A in the surface of the deposited insulating material and an area corresponding to an area where the p-side electrode 13 in the semiconductor photodetector 1 is to be formed. Subsequently, using the photoresist as a mask, for example, the insulating material is selectively removed by wet etching using a hydrofluoric-acid-based etchant, thereby forming the light transmitting parts 43A and 43B. After that, a layer is formed by a metal, such as gold (Au), by the vacuum evaporation method, and the photoresist is removed, thereby forming the metal parts 44A and 44B. As a result, the joining layers 42A and 42B are formed (FIGS. 10A and 10B).

Figure 11:
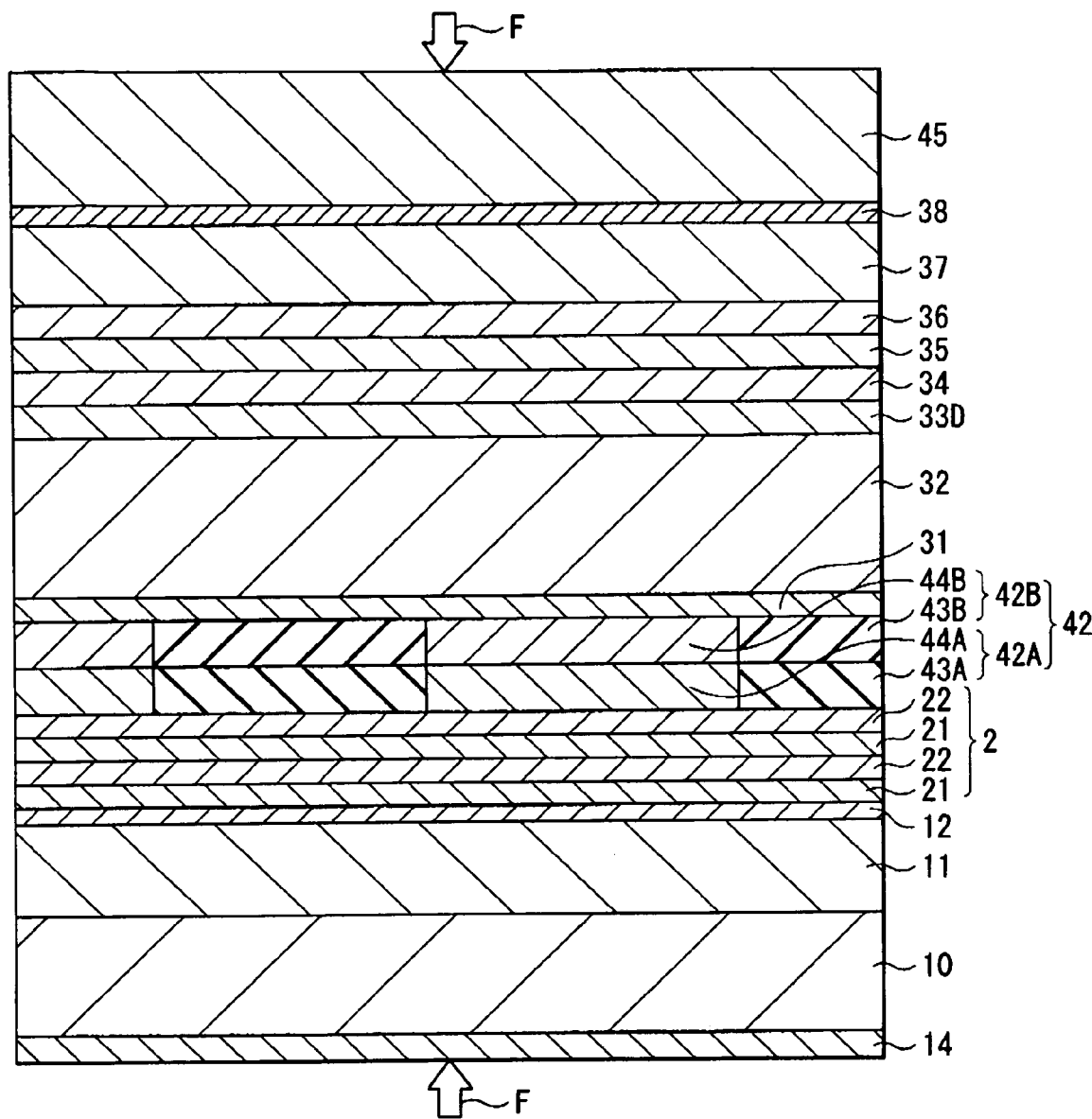
FIG. 11 is a cross section illustrating a process subsequent to FIGS. 10A and 10B.

In a state where the joining layers 42A and 42B face each other at a high temperature, a pressure F is applied from the side of the substrates 10 and 45 to join the joining layers 42A and 42B to each other (FIG. 11). The joining layer 42 is formed and, as a result, the semiconductor photodetector 1, the multilayer filer 2, and the VCSEL 3 are formed integrally. The substrate 45 is removed by, for example, wet etching. After that, by performing processes similar to the above, the semiconductor light emitting device of the embodiment is formed.

As described above, in the embodiment, an insulating material such as $SiO_2$ is used for the light transmitting part 43 and a metal such as Au is used for the metal part 44. Consequently, the joining layer 42 having the light transmitting part 43 and the metal part 44 may be formed by patterning. As compared with the case of forming a layer having a function equivalent to that of the joining layer 42 (the function of regulating the incidence area of light to the semiconductor photodetector 1), the device is formed more precisely. As described above, in the embodiment, the method having high controllability may be used, so that variations in the properties of semiconductor light emitting devices may be reduced extremely.

At the time of manufacturing a layer having a function equivalent to that of the joining layer 42 (the function of regulating the incidence area of light to the semiconductor photodetector 1), it is unnecessary to use the oxidizing process. Consequently, there is no possibility of the occurrence of peeling due to volume shrinkage in the joining layer 42. Thus, the yield and reliability is much higher than that in the case using the process accompanying volume shrinkage, such as an oxidizing process.

Since the metal parts 44A and 44B are joined to each other, adhesion between the multilayer filter 2 and either the semiconductor photodetector 1 or the VCSEL 3 is increased. Since the joined parts do not peel from each other, it is not feared that the yield and reliability will deteriorate due to the joining.

The semiconductor photodetector 1 and the VCSEL 3 are crystal-grown on different substrates. Consequently, as compared with the case where they are formed on the same substrate, crystal growth may be performed with higher quality. As a result, the device properties and reliability are further improved.

Although the present invention has been described by the foregoing embodiments, the invention is not limited to the foregoing embodiments, and it can be modified variously.

For example, in the foregoing embodiments, the case where the multilayer filter 2 is made of a Group-III compound semiconductor containing aluminum (Al) as a Group-III element has been described. In the second embodiment, the multilayer filter 2 may have a stack structure obtained by alternately stacking insulating materials having different refractive indexes. For example, the multilayer filter 2 may be formed by stacking 10 low-refractive-index layers made of $SiO_2$ and each having a thickness of $\lambda_1/4n_7$ ($n_7$ denotes the refractive index) and 10 high-refractive-index layers made of SiN and each having a thickness of $\lambda_1/4n_8$. When insulating materials having different refractive indexes are alternately stacked, as compared with the foregoing embodiments, the difference between the refractive indexes is made larger. Therefore, the multilayer filter 2 may be formed with a number of stacked layers smaller than that in the foregoing embodiment.

In the foregoing embodiment, the case has been described in which the multilayer filter 2 and the semiconductor photodetector 1 are disposed in order from the VCSEL 3 on the side opposite to the side where light of the VCSEL 3 is emitted mainly to the outside. Alternately, for example, on the side where light of the VCSEL 3 is emitted mainly to the outside, the multilayer filter 2 and the semiconductor photodetector 1 may be disposed in order from the VCSEL 3 side.

Although the case of using a GaAs-based compound semiconductor as the semiconductor material has been described in the foregoing embodiments, other materials, such as a GaInP-based (red-based) material, an AlGaAs-based (infrared-based) material, a GaN-based (blue-green-based) material, or the like, also may be used.

It should be understood by those skilled in the art that various modifications, combinations, subcombinations and alterations may occur depending on design requirements and other factors insofar as they are within the scope of the appended claims or the equivalents thereof.

What is claimed is:

1. A semiconductor light emitting device comprising:
   a semiconductor light emitting element for generating light including stimulated emission light having a wavelength $\lambda o$ and spontaneous emission light having a wavelength band including the wavelength $\lambda o$;
   a multilayer filter having a stack structure in which a low-refractive-index layer having a thickness of $\lambda_1/(4 \times n_a)$ ($\lambda_1 < \lambda o$, and $n_a$ denotes the refractive index) and a high-refractive-index layer having a thickness of $\lambda_1/(4 \times n_b)$ ($n_b > n_a$, and $n_b$ denotes the refractive index) are stacked alternately; and
   a semiconductor photodetector having a light absorption layer that absorbs part of the light passed through the multilayer filter.

2. The semiconductor light emitting device according to claim 1, wherein the multilayer filter has a stack structure in which a low-refractive-index layer having a thickness of $\lambda_2/(4 \times n_c)$ ($\lambda_2 > \lambda o$, and $n_c$ denotes the refractive index) and a high-refractive-index layer having a thickness of $\lambda_2/(4 \times n_d)$ ($n_d > n_c$, and $n_d$ denotes the refractive index) are stacked alternately.

3. The semiconductor light emitting device according to claim 1, wherein the semiconductor light emitting element has a stack structure including a first multilayer reflector, a first cladding layer, an active layer, a second cladding layer, and a second multilayer reflector in this order, and each of the first and second multilayer reflectors is formed by alternately stacking a low-refractive-index layer having a thickness of $\lambda o/(4 \times n_e)$ ($n_e$ denotes the refractive index) and a high-refractive-index layer having a thickness of $\lambda o/(4 \times n_f)$ ($n_f > n_e$, and $n_f$ denotes the refractive index) are alternately stacked.

4. The semiconductor light emitting device according to claim 1, wherein the low-refractive-index layer and the high-refractive-index layer are made of a compound semiconductor.

5. The semiconductor light emitting device according to claim 4, wherein the low-refractive-index layer and the high-refractive-index layer are made of a Group-III-V compound semiconductor containing aluminum (Al) as a Group-III element, and an Al elemental ratio of the low-refractive-index layer is higher than an Al elemental ratio of the high-refractive-index layer.

6. The semiconductor light emitting device according to claim 1, wherein the low-refractive-index layer and the high-refractive-index layer are made of an insulating material.

7. The semiconductor light emitting device according to claim 6, wherein the low-refractive-index layer is made of $SiO_2$, and the high-refractive-index layer is made of SiN.

8. The semiconductor light emitting device according to claim 1, wherein the semiconductor photodetector, the multilayer filter, and the semiconductor light emitting element are formed in this order on a substrate by epitaxial crystal growth.

9. The semiconductor light emitting device according to claim 1, wherein the multilayer filter and either the semiconductor light emitting element or the semiconductor photodetector are joined to each other with a joining layer in between.

10. A semiconductor light emitting device comprising:
a semiconductor light emitting element for generating light including stimulated emission light having a wavelength $\lambda o$ and spontaneous emission light having a wavelength band including the wavelength $\lambda o$;
a multilayer filter having a stack structure in which a low-refractive-index layer having a thickness of $\lambda_2/(4 \times n_c)$ ($\lambda_2 > \lambda o$, and $n_c$ denotes the refractive index) and a high-refractive-index layer having a thickness of $\lambda_2/(4 \times n_d)$ ($n_d > n_c$, and $n_d$ denotes the refractive index) are stacked alternately; and
a semiconductor photodetector having a light absorption layer that absorbs a part of light passed through the multilayer filter.

* * * * *